US009935271B2

(12) United States Patent
Li

(10) Patent No.: US 9,935,271 B2
(45) Date of Patent: Apr. 3, 2018

(54) ORGANIC ELECTROLUMINESCENT DEVICE BASED ON NEUTRAL FREE-RADICAL ELECTROLUMINESCENT MATERIAL

(71) Applicant: JILIN UNIVERSITY, Changchun (CN)

(72) Inventor: Feng Li, Changchun (CN)

(73) Assignee: JILIN UNIVERSTIY, Changchun, Jilin Province (CN)

( * ) Notice: Subject to any disclaimer, the term of this patent is extended or adjusted under 35 U.S.C. 154(b) by 267 days.

(21) Appl. No.: 14/659,025

(22) Filed: Mar. 16, 2015

(65) Prior Publication Data

US 2016/0099415 A1    Apr. 7, 2016

(30) Foreign Application Priority Data

Jan. 15, 2014   (CN) .......................... 2014 1 0018393
Nov. 11, 2014   (CN) .......................... 2014 1 0639989

(51) Int. Cl.
*H01L 51/00*        (2006.01)
*H01L 51/50*        (2006.01)

(52) U.S. Cl.
CPC ...... *H01L 51/0058* (2013.01); *H01L 51/0052* (2013.01); *H01L 51/0067* (2013.01); *H01L 51/0072* (2013.01); *H01L 51/5012* (2013.01); *C09K 2211/1007* (2013.01); *C09K 2211/1011* (2013.01); *C09K 2211/1051* (2013.01); *H01L 51/0081* (2013.01); *H01L 51/5016* (2013.01); *H01L 2251/303* (2013.01); *H01L 2251/308* (2013.01)

(58) Field of Classification Search
CPC ......... H01L 51/5016; H01L 2251/5384; H01L 51/0052; H01L 51/0059; H01L 51/0062
See application file for complete search history.

(56) References Cited

U.S. PATENT DOCUMENTS 4,769,292 A   9/1988  Tang et al.
5,811,833 A * 9/1998  Thompson ............. B82Y 10/00
                                            257/103
6,303,238 B1  10/2001 Thompson et al.
2009/0160319 A1* 6/2009  Song .................. H01L 51/5048
                                            313/504
2012/0299037 A1* 11/2012 Lee ..................... H01L 51/5206
                                            257/98

OTHER PUBLICATIONS

Haze et al (Water-Soluble Narrow-Line Radicals for Dynamic Nuclear Polarization (J. Am. Chem. Soc. 2012, 134, 14287-14290), published Aug. 23, 2012.*
Dane et al (Carbanionic Route to Electroactive Carbon-Centered Anion and Radical Oligomers, Org. Lett., vol. 12, No. 19, 2010, pp. 4324-4327, Published on Web Sep. 10, 2010.*
USPTO structure search, Mar. 2017.*
Baldo et al., "Highly efficient phosphorescent emission from organic electroluminescent devices", Nature, vol. 395, pp. 151-154, Sep. 1998.
Tang et al, "Organic electroluminescent diodes", Applied Physics Letters, vol. 51, pp. 913-915, 1987.
Ma et al., "Electroluminescence from triplet metal-ligand charge-transfer excited state of transition metal complexes", Synthetic Metals vol. 94, pp. 245-248, 1998.
Castellanos et al., "Taking advantage of the radical character of Tris(2,4,6-trichlorophenyl)methyl to synthesize new paramagnetic glass molecular materials," J. Org. Chem., 2008, vol. 73, pp. 3759-3767.

* cited by examiner

*Primary Examiner* — Gregory Listvoyb
(74) *Attorney, Agent, or Firm* — Hamre, Schumann, Mueller & Larson, P.C.

(57) ABSTRACT

Disclosed is an organic electroluminescent device, wherein the light-emitting layer is composed of a non-doped neutral free-radical electroluminescent material or a neutral free-radical electroluminescent material doped in a matrix material. The luminescence of the device is from the photons emitted from the transition of doublet electrons in the outer molecular orbit of the neutral free-radical electroluminescent material from an excited state to the ground state; since there is no limitation on spin-forbidden, the upper limit of the internal quantum efficiency of the device is 100%. The neutral free-radical electroluminescent material used in the device is 1,3-bis(diphenylene)-2-phenylallyl free radicals and derivatives thereof; tri(2,4,6-trichlorophenyl)methyl free radicals and derivatives thereof; (3,5-dichloro-4-pyridyl)bis(2,4,6-trichlorophenyl)methyl free radicals and derivatives thereof; (2,4,6-trichloro-5-pyrimidinyl)bis(2,4,6-trichlorophenyl)methyl free radicals and derivatives thereof.

16 Claims, 3 Drawing Sheets

ORGANIC ELECTROLUMINESCENT DEVICE BASED ON NEUTRAL FREE-RADICAL ELECTROLUMINESCENT MATERIAL

TECHNICAL FIELD

The invention relates to an organic electroluminescent device, and in particular an organic electroluminescent device using a neutral free-radical electroluminescent material as a light-emitting layer.

BACKGROUND ART

The organic electroluminescent device exhibits a bright application prospect in the display and illumination fields since it has the advantages, such as a simple manufacturing process, a wide range of materials, a controllable structure, being super-thin and flexible, etc. Some organic electroluminescent devices industrially applicable or close to industrially applicable have appeared, for example, display screens based on an active matrix organic electroluminescent diode from the Samsung company have been widely used in Galaxy series mobile phones and the large size televisions thereof also have appeared on the market. The organic white-light illumination technology also has been developing towards the target of low-cost, high-efficiency, and long-life flat-panel light sources.

In the organic fluorescent electroluminescent device invented by C. W. Tang et al., (U.S. Pat. No. 4,769,292; C. W. Tang et al., Appl. Phys. Lett 51, 913 (1987)), an organic fluorescent light-emitting material is used for luminescence in 1987. Under the application of an electric field, holes and electrons are injected from an anode and a cathode of a device, respectively, and they meet in a light-emitting area, forming excitons which emit light by radiative recombination. In the context of random spin directions of the electrons and holes injected, the resulting ratio of the singlet excitions to the triplet excitions is 1:3; for an organic fluorescent material, the transition of a triplet exciton to the ground state is forbidden, there is only luminescence from the transition of a singlet exciton to the ground state; therefore the internal quantum efficiency of the device has an upper limit of 25%.

In order to break through the upper limit of 25% of the internal quantum efficiency in an organic fluorescent electroluminescent device, M. E. Thompson et al., and Yuguang Ma. et., have invented organic phosphorescent electroluminescent devices (i.e., a device in which an organic phosphorescent material is used for luminescence, U.S. Pat. No. 6,303,238; M. A. Baldo, et al., Nature 395, 151, (1998); Y. G. Ma, et al., Synth. Met. 94, 245, (1998)). They incorporate heavy metal atoms in the organic light-emitting materials, i.e., the organic phosphorescent materials, wherein the transition of a triplet exciton to the ground state becomes possible by the strong spin-orbital coupling of the heavy metal atom. For the organic phosphorescent electroluminescent device, the internal quantum efficiency can reach 100%. However, the current high-efficiency organic phosphorescent materials are all expensive rare metal coordination complexes, resulting significant increase of the production costs of organic phosphorescent electroluminescent devices.

In the organic florescent electroluminescent devices, the light emission of the singlet excitions are used (the upper limit of the internal quantum efficiency is only 25%); in the organic phosphorescent electroluminescent device, the light emission of the triplet excitions are used (the organic phosphorescent light-emitting materials are expensive); they have disadvantages of their own; therefore it is a trend to develop an organic electroluminescent device which can reach an upper limit of internal quantum efficiency of 100% without using expensive rare metals. So far there is no report on an organic electroluminescent device using a neutral free-radical electroluminescent material as a light-emitting layer.

Contents of Invention

An object of the present invention is to provide an organic electroluminescent device, which emits light on the basis of the transition of a doublet electron between different orbits of organic neutral free-radical electroluminescent materials, can replace an organic phosphorescent electroluminescent device. The device based on organic neutral free-radical electroluminescent materials has relatively low costs and has an internal quantum efficiency upper limit of 100%.

The neutral free-radical electroluminescent materials described in the present invention are classified into the following four classes: 1,3-bis(diphenylene)-2-phenylallyl free radicals and derivatives thereof; tri(2,4,6-trichlorophenyl)methyl free radicals and derivatives thereof; 3,5-dichloro-4-pyridyl)bis(2,4,6-trichlorophenyl)methyl free radicals and derivatives thereof; (2,4,6-trichloro-5-pyrimidinyl)bis(2,4,6-trichlorophenyl)methyl free radicals and derivatives thereof, and have the following general structures:

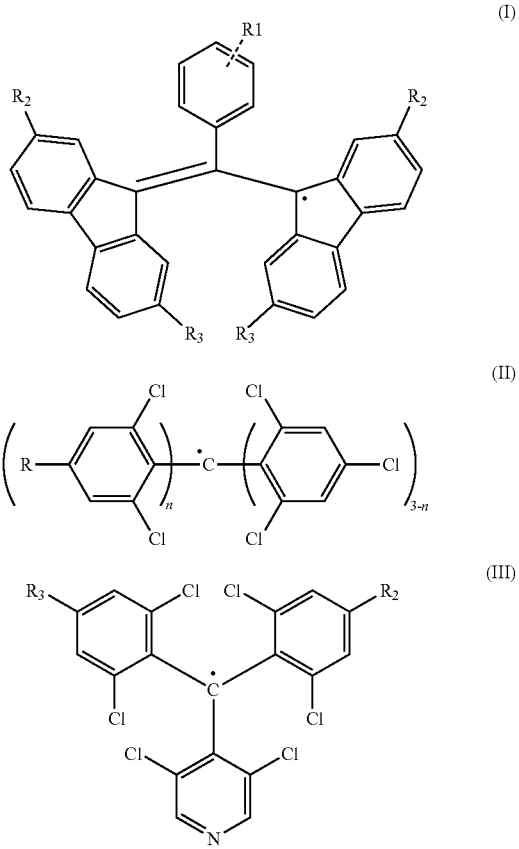

-continued

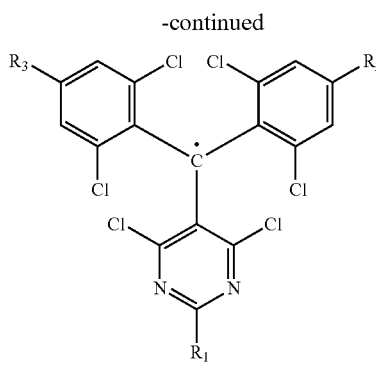

(IV)

n = 1, 2, 3 wherein R, $R_1$, $R_2$ and $R_3$ are the same or different, R, $R_1$, $R_2$, $R_3$=H, F, Cl, CN . . .

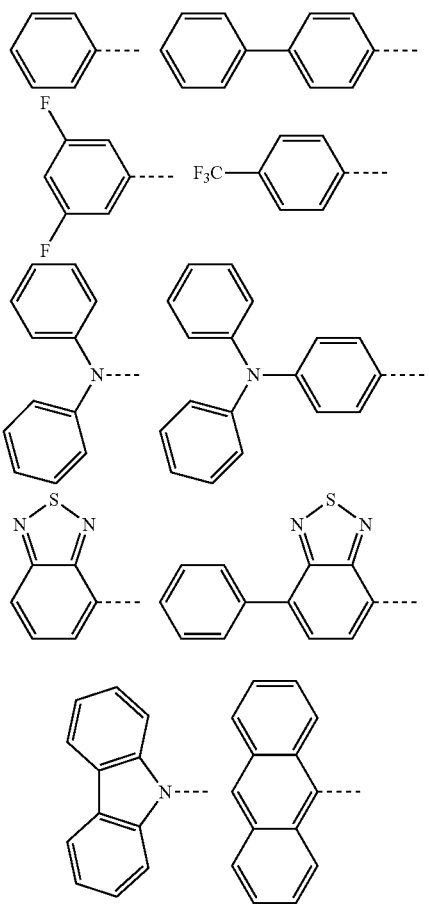

wherein R, $R_1$, $R_2$ and $R_3$ are selected from an aromatic amine, heterocyclic aromatic hydrocarbon or fused ring aromatic hydrocarbon compound or an atom, a group as shown in the above formulas or a derivative from any combination thereof.

During the preparation of an organic electroluminescent device, the above-mentioned neutral free-radical electroluminescent material can be made as a light-emitting layer of the device by evaporation, etc.

Comparing with the Prior Art, the Present Invention has the Following Advantages:

(1) since there is only one electron in the outermost molecular orbital of an neutral free-radical electroluminescent material, the spin quantum number of one electron is ½, corresponding to a doublet state. The light emission of the organic electroluminescent device in the present invention is from the transition of the doublet electron of the organic neutral free-radical molecules from a higher level molecular orbit to a lower level singly occupied molecular orbit (SOMO), which is different from the emission from a singlet excition or a triplet excition;

(2) an electron from the outermost molecular orbit (SOMO) of the organic neutral free-radical electroluminescent material is excited to a higher level molecular orbit, and when the electron transits downward, it faces an empty molecular orbit, thus there is no limitation of Pauli-exclusion-forbidden transition; therefore the device using the emission of neutral free-radical molecules has an upper limit of the internal quantum efficiency of 100%.

PARTICULAR EMBODIMENTS

Figure 1:
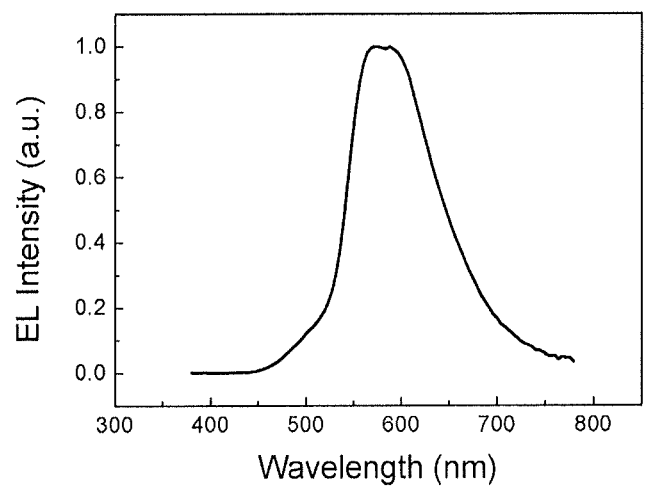
FIG. 1: an electroluminescence spectrum of a device at a voltage of 6 V, characterizing the luminescence spectrum of the device from example 5.

The present invention is further described in detail in combination with particular embodiments. It is to be understood that the present invention is not limited to the following embodiments, which are just illustrative embodiments of the present invention.

Example of the Synthesis Process of Organic Neutral Free-Radical Electroluminescent Material Example 1: Synthesis of 1,3-bisdiphenylene-2-phenylallyl Free Radical and Derivatives Thereof Synthesis of the first class (I) of free radicals, they are prepared according the method reported in the documents (J. Chem. Soc., Perkin Trans. 1, 2000, 971-979) and (Org. Lett., 2009, 11, (9), 171-1874.); the 1,3-bisdiphenylene-2-phenylallyl free radical is exemplified for illustration.

Step 1: Preparation of 2,7-disubstituted-9-(substituted benzylidene)-9H-fluorene Step 2: Preparation of 2,7-disubstituted-9-bromo-9-[bromo-(substituted benzylidene)]-9H-Fluorene

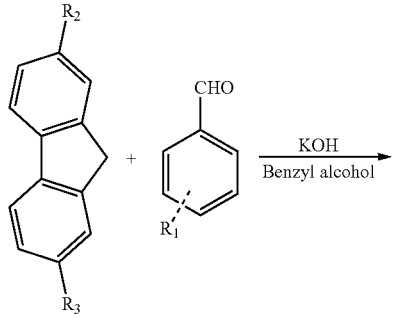

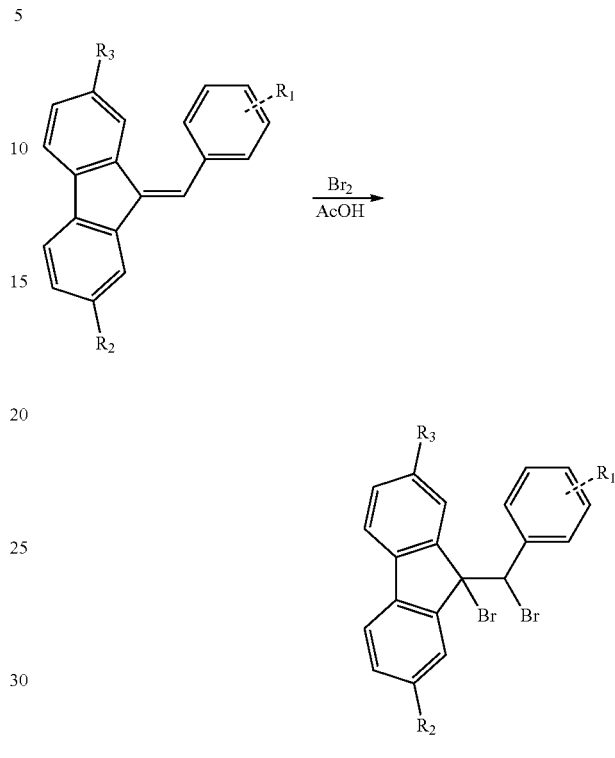

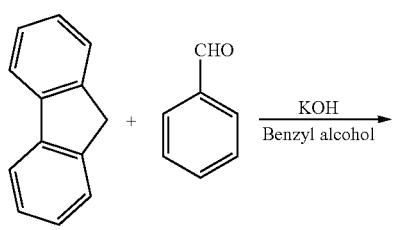

The preparation of 9-benzylidene-9H-fluorene is exemplified for illustration.

The preparation of 9-bromo-9-[bromo-(phenyl)methyl]-9H-fluorene was exemplified for illustration.

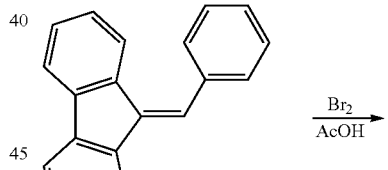

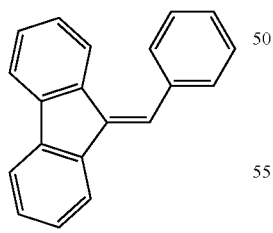

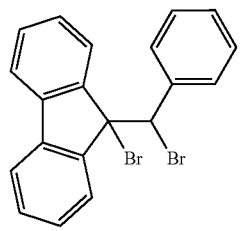

To a 500 mL reaction bottle, fluorene (41 g, 0.25 mol), KOH (20 g, 0.36 mol), benzaldehyde (40 mL, 0.4 mol) and 200 mL benzyl alcohol were added and reacted at 95° C. for 1.5 h. The reaction mixture was poured into 2 L pure water, stirred overnight and the precipitate was filtered by suction and washed with ethanol to obtain a white crystal (4.3 g, 73%). ¹H NMR and mass spectrometry results confirmed that the product was 9-benzylidene-9H-fluorene.

To a reaction bottle, 9-benzylidene-9H-fluorene (12.5 g, 4 mmol) and 200 mL of an acetic acid solution were added, and then Br₂ (7.6 g, 48 mmol) was added dropwise with stirring and reacted overnight; after the completion of the reaction, the mixture was filtered by suction and the resulting solid is washed several times with ethyl ether to obtain the title compounds as white crystal (18.4 g, 89%). ¹H NMR and mass spectrometry results confirmed that the product was 9-bromo-9-[bromo-(phenyl)methylene]-9H-fluorene.

Step 3: Preparation of 2,7-disubstituted-9-[-bromo-(substituted phenyl)methylene]-9H-fluorene

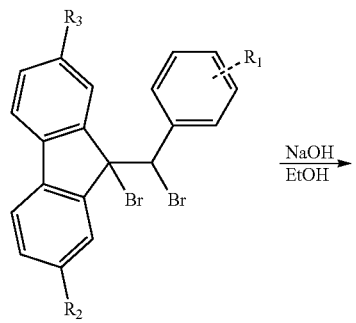

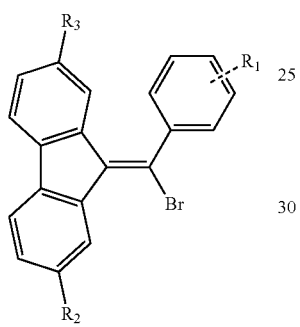

The preparation of 9-[bromo-(phenyl)methylene]-9H-fluorene was exemplified for illustration.

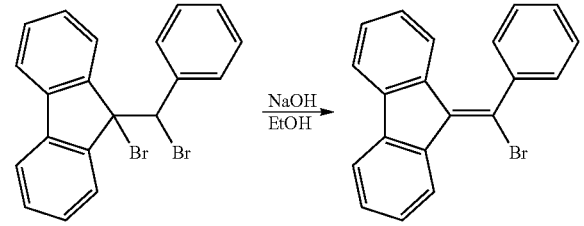

To a reaction bottle, 9-bromo-9-[bromo-(phenyl)methyl]-9H-fluorene (18.4 g, 44 mmol) and NaOH (99 g, 2.4 mol) were added and then 500 mL of anhydrous ethanol was added therein, heated to refluxing, reacted for 1 h, and then cooled to room temperature, neutralized with diluted hydrochloric acid and then the mixture was extracted with ethyl acetate, washed several times with saline water, and dried to over magnesium sulfate; the solvent was evaporated under a reduced pressure and a yellow solid was obtained (12.6 g, 85%). $^1$H NMR and mass spectrometry results confirmed that product was 9-[bromo-(phenyl)methylene]-9H-fluorene.

Step 4: Preparation of ((2,7-disubstituted-9H-fluorene-9-vinylidene)-2,7-disubstituted (9H-fluorene-9-yl)methylene)substituted benzene

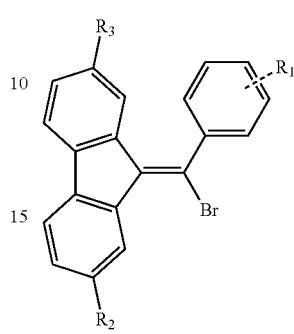 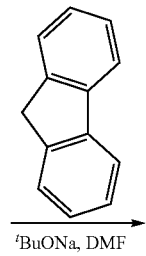

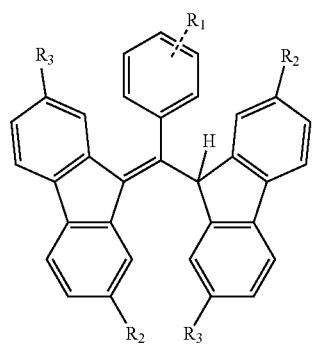

The preparation of ((9H-fluorene-9-vinylidene) (9H-fluorene-9-yl)methylene)benzene was exemplified for illustration.

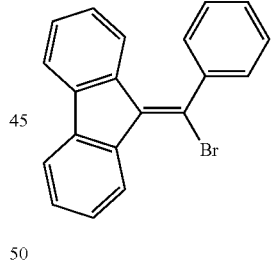 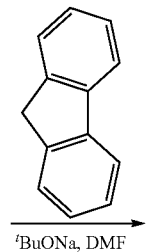

To a 100 mL two-necked reaction bottle, fluorene (0.182 g, 1.1 mmol) and sodium tert-butoxide (0.35 g, 3.65 mmol) were added; then the reaction bottle was evacuated and charged with nitrogen and repeated three times; then 25 mL of anhydrous DMF was added and stirred for 5 min. To another 100 mL two-necked bottle, ((9H-fluorene-9-vinylidene), (9H-fluorene-9-yl)methylene) (0.243 g, 0.73 mmol) was added; the reaction bottle was evacuated and charged with nitrogen and repeated three times; then 10 mL of anhydrous DMF is added therein; after the complete dissolution, the solution was added dropwise to the solution of (fluorene and sodium tert-butoxide in DMF) prepared in step 1 and the reaction mixture changed into blue. The mixture was reacted at room temperature for 1 h, then cooled with ice bath and 1 M dilute hydrochloric acid solution was added to the reaction mixture until the blue disappeared; then the reaction mixture was diluted with water, extracted with ethyle acetate, washed with each of water and brine several times and dried over magnesium sulfate. The crude product was purified by silica gel chromatography eluting with methylene chloride:methanol=95:5 (V\V). After removing the solvent (0.24 g, 79%) of product was achieved. $^1$H NMR and mass spectrometry results confirmed that product was ((9H-fluorene-9-vinylidene), (9H-fluorene-9-yl)methylene)benzene.

Step 5: Preparation of ((2,7-disubstituted-9H-fluorene-9-vinylidene)-2,7-disubstituted (9H-fluorene-9-yl)methylene)substituted phenyl free radical

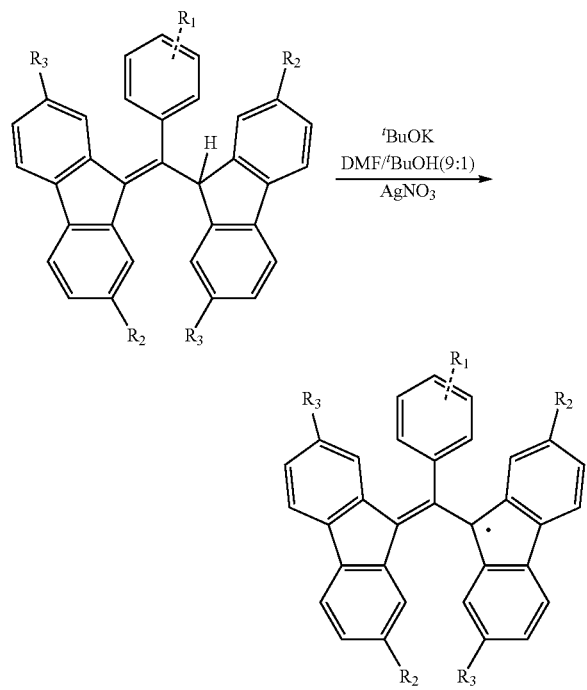

The preparation of the ((9H-fluorene-9-vinylidene), (9H-fluorene-9-yl)methylene)phenylallyl free radical, i.e., 1,3-bis(diphenylene)-2-phenylallyl free radical was exemplified for illustration.

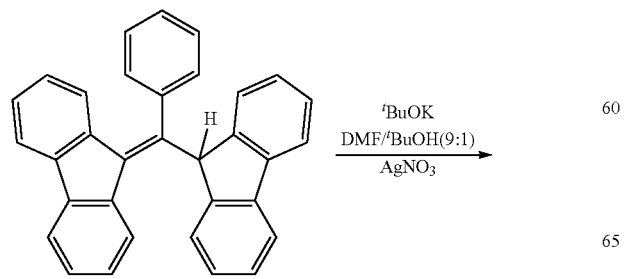

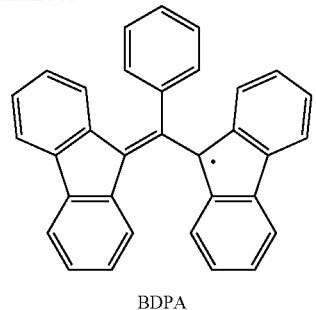

BDPA

To a 100 mL two-necked reaction bottle, ((9H-fluorene-9-vinylidene), (9H-fluorene-9-yl)methylene)benzene (0.054 g, 0.13 mmol) and potassium tert-butoxide (0.044 g, 0.9 mmol) were added; then the reaction bottle was evacuated and charged with nitrogen and this was repeated three times; the 80 mL anhydrous DMF: t-butanol (9:1) was added. The reaction mixture was stirred vigorously for 20 min and then silver nitrate (0.066 g, 0.390 mmol) was dissolved in 1.5 mL of water and added to the reaction. After stirring for 2 min, additional water was added and extracted with ethyl ether; the organic layer was washed with water and brine four times, dried over magnesium sulphate. In order to ensure the complete removal of trace silver nitrate, the ether solution was filtered through a small plug of silica on a fritted funnel, the solvent was evaporated out under a reduced pressure, and a dark brown solid was obtained (0.044 g, 82%). EPR and mass spectrometry results confirmed that product was ((9H-fluorene-9-vinylidene), (9H-fluorene-9-yl)methylene) phenyl free radical.

In addition, 4-49H-fluorene-9-vinylidene)(9H-fluorene-9-yl)methylene)benzonitrile free radical was exemplified for the illustration of the preparation of other derivatives of the free radical in this class.

The steps for the synthesis of 4-((9H-fluorene-9-vinylidene) (9H-fluorene-9-yl)methylene)benzonitrile free radical are similar to those above, only except that the starting material benzaldehyde in step 1 was replaced with 4-caynobenzaldehyde.

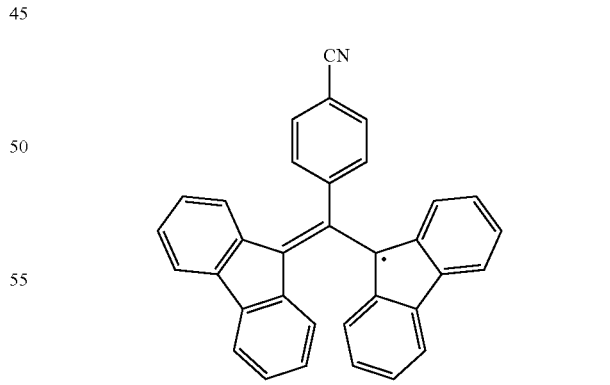

Example 2: Synthesis of tri(2,4,6-trichlorophenyl)methyl Free Radical and Derivative Thereof Synthesis of the second class (II) of free radicals; they are prepared according to the methods reported by Luis Julia (J.

Org. Chem., 2008, 73, (10), 3759-367) and reported in the document (Chem. Eur. J. 2006, 12,9238-9253); the tri(2,4,6-trichlorophenyl)methyl free radical was exemplified for illustration.

Step 1: Preparation of tri(2,4,6-trichlorophenyl)methane

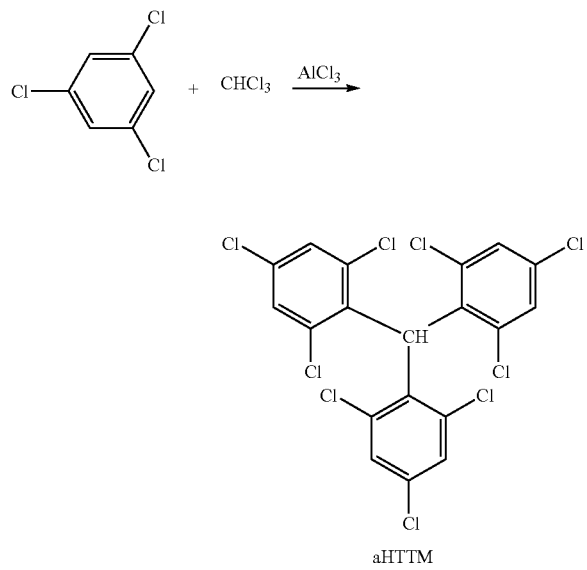

aHTTM

A mixture of 1,3,5-trichlorobenzene (10.14 g, 55.9 mmol), anhydrous chloroform (0.5 mL, 6.2 mmol) and anhydrous aluminium chloride (0.91 g, 6.8 mmol) was heated at 80° C. for 2.5 h in a glass pressure vessel. After cooling to room temperature, the reaction mixture was poured into 1 M hydrochloric acid and extracted with chloroform three times and dried over sodium sulfate. The solvent was evaporated and the product was purified by silica gel chromatography eluting with petroleum ether. A white solid (2.8 g, 82%) was obtained. $^1$H NMR and mass spectrometry results confirm that product was tri(2,4,6-trichlorophenyl)methane.

Step 2: Preparation of tri(2,4,6-trichlorophenyl)methyl free radical

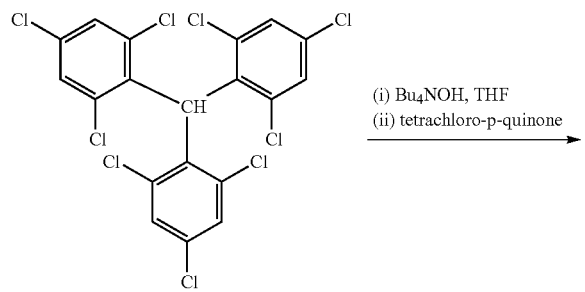

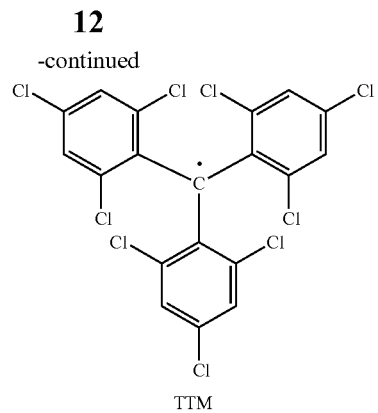

TTM

Under the nitrogen atmosphere, tetrabutyl ammonium hydroxide solution in methanol (0.8 mL, 2.34 mmol, 2 M) was added to the a solution of tri(2,4,6-trichlorophenyl)methane (aHTTM) (0.732 g, 1.32 mmol) in freshly distilled THF (35 mL). The mixture was allowed to react at room temperature in dark for 5 h; then p-chloranil (0.876 g, 3.564 mmol) was added and further reacted for 1 h, the solvent was evaporated. The product was purified by silica gel chromatography eluting with petroleum ether, and a dark red solid was obtained (0.62 g, 85%). EPR and mass spectrometry results confirmed that product was tri(2,4,6-trichlorophenyl)methyl free radical (TTM).

Step 3: Preparation of tri(2,6-dichloro-4 substituted-phenyl)methyl free radical

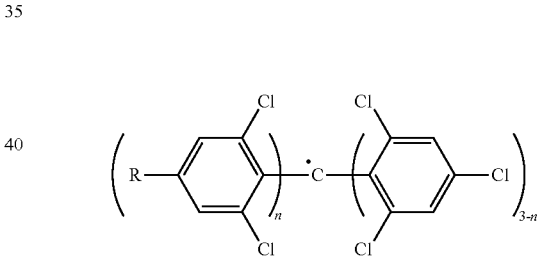

$n = 1, 2, 3$

[4-(N-carbazolyl)-2,6-dichlorophenyl]bis(2,4,6-trichlorophenyl)-methyl free radical was exemplified for the illustration of other derivatives of this class free radical.

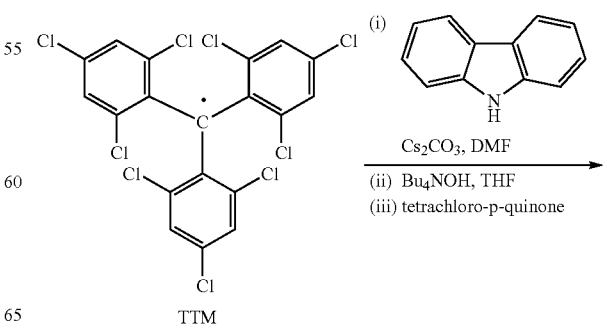

TTM

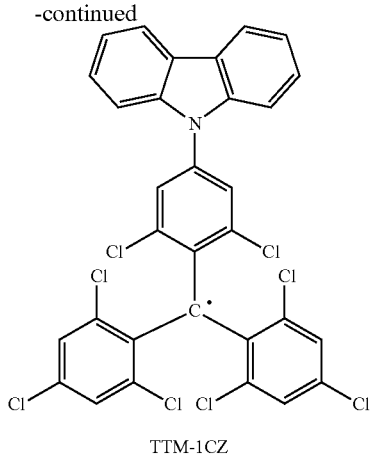

TTM-1CZ

Under the nitrogen atmosphere, a 50 mL two-necked round-bottom flask was charged with tri(2,4,6-trichlorophenyl)methyl free radical (TTM) (1.0 g, 1.81 mmol), carbazole (1.51 g, 9.05 mmol), cesium carbonate (0.94 g, 2.9 mmol) and 20 mL DMF and heated to 160° C. in the dark for 2 h. After the reaction finished, the mixture was cooled to room temperature and poured into a 1 M hydrochloric acid solution, a large amount of grey precipitate was obtained, which are filtered, washed with water, dried and purified by silica gel chromatography eluting with petroleum ether: methylene dichloride/5:1 (V\VV/V). A red brown solid, [4-(N-carbazolyl)-2,6-dichlorophenyl]bis(2,4,6-trichlorophenyl) methane (0.31 g, 25%) was obtained, which was directly reacted in the next step. Under the nitrogen atmosphere and in dark, tetrabutylammonium hydroxide solution in methanol (0.32 mL, 0,639 mmol, 2 M) was added to the solution of [4-(N-carbazolyl)-2,6-dichlorophenyl]bis(2,4,6-trichlorophenyl)methane (0.31 g, 0.45 mmol) in freshly distilled 25 mL THF and stirred at room temperature for 5 h. After than p-chloranil (0.30 g, 1.22 mmol) was added and reacted additionally for 1 h. The solvent was evaporated, the mixture was purified by silica gel chromatography eluting with petroleum ether:methylene dichloride=5:1 (V\V) to obtain a purple brown solid (0.268 g, 87%). EPR and mass spectrometry results confirmed that product was [4-(N-carbazolyl)-2,6-dichlorophenyl]bis(2,4,6-trichlorophenyl)-methyl free radical (TTM-1CZ).

Example 3: Synthesis of (3,5-dichloro-4-pyridyl)bis(2,4,6-trichlorophenyl)methyl Free Radical and Derivative Thereof Synthesis of the third class (III) of free radical, they are prepared according to the method in the documents (Tetrahedron, 2006, 62, 5915-5921) and (Angew. Chem. Int. Ed. 2014, 53, 1-5). (3,5-dichloro-4-pyridyl)bis(2,4,6-trichlorophenyl)methyl free radical was exemplified for illustration.

Step 1: Preparation of 3,5-dichloropyridine-4-dehyde

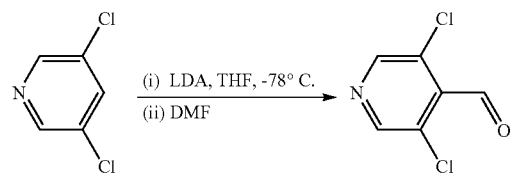

Under nitrogen atmosphere, a 250 mL two-necked round-bottom flaskcharged with freshly distilled diisopropyl amine (7.25 mL, 37.2 mmol) and 10 mL THF and cooled to −78° C., then a butyl lithium (n-BuLi) solution (23.1 mL, 37 mmol) in n-hexane was added slowly, after then reaction was maintained at −78° C. for 0.5 h and reaction mixture slowly warming to room temperature, another 30 mL TH was added to the reaction. The temperature of cooled to −78° C. again, 3,5-dichloropyridine (5 g, 33.7 mmol) solution in 60 mL THF was added dropwise and reacted for 1 h, a mixture solution of DMF (3.14 mL, 5.7 mmol) and 15 mL THF was added dropwise to the reaction and stirered at −78° C. for 2 h. Reaction was warmed to room temperature, the mixture was poured into 400 mL of a saturated sodium carbonate solution, extracted with ethyl acetate, washed with a sodium carbonate solution and brine several times, dried over magnesium sulfate and purified by silica gel chromatography eluting with petroleum ether:ethyl acetate=10:1 (V\V). Obtained a light yellow solid (4.81 g, 81%). $^1$H NMR and mass spectrometry results confirmed that product was 3,5-dichloropyridine-4-aldehyde.

Step 2: Preparation of (3,5-dichloro-4-pyridinyl)bis(2,4,6-trichlorophenyl)methane

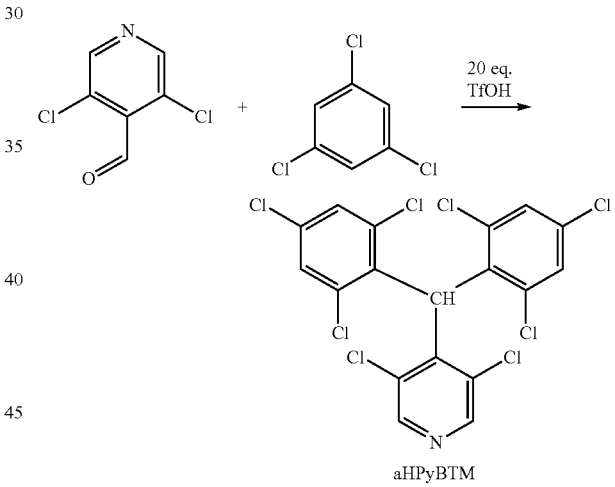

aHPyBTM

A 100 mL round-bottom flask was charged with 3,5-dichloropyridine-4-aldehye (1.76 g, 10.0 mmol), 1,3,5-trichlorobenzene (18.14 g, 100 mmol) and trifluoromethanesulphonic acid (30.0 g, 200 mmol) and heated to 180° C. for 10 h. After the reaction was completed and cooled to room temperature, the mixture was dissolved with dichloromethane and added to ice water. The mixture was neutralized to pH 7 using saturated sodium hydrogen carbonate solution, extracted with dichloromethane, washed with a sodium hydrogen carbonate solution several times, dried over magnesium sulphate. The solvent was evaporated under the reduced pressure. Product was purified by silica gel chromatography eluting with petroleum ether:methylene dichloride=1:1 (V\V). A white solid (2.6 g, 50%) was obtained. $^1$H NMR and mass spectrometry results confirmed that product was (3,5-dichloro-4-pyridine)bis(2,4,6-trichlorophenyl)methane.

Step 3: Preparation of (3,5-dichloro-4-pyridinyl)bis(2,4,6-trichlorophenyl)methyl free radical

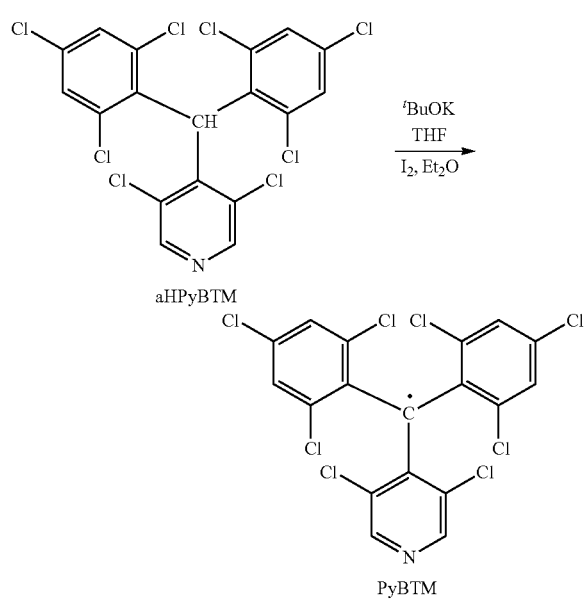

Under the nitrogen atmosphere and in the dark, a 250 mL round-bottom flask was charged with (3,5-dichloro-4-pyridinyl)bis(2,4,6-trichlorophenyl)methane (aHPyBTM) (468 mg, 0.90 mmol), 30 mL freshly distilled THF A potassium tert-butoxide solution in THF (1.4 mL, 1 M) was added dropwise and the reaction mixture turned into red immediately and reacted overnight. An I₂ (1.328 g, 5.21 mmol) solution in 60 mL anhydrous ethyl ether was added dropwise and the mixture was reacted for 2.25 h. The excessive I₂ was washed with a 10% Na₂S₂O₃ solution three times, the water layer was extracted with ethyl ether several times, dried over anhydrous MgSO₄. The solvent was evaporated, Product was purified by Al₂O₃ column chromatography eluting with (ethyl ether:petrolum ether=1:4; V\V). a dark red solid was obtained (400 mg, 88%). EPR and mass spectrometry results confirmed that product was (3,5-dichloro-4-pyridinyl)bis(2,4,6-trichlorophenyl)methyl free radical.

Step 4: Preparation of [(3,5-dichloro-4-pyridinyl)(4-substituted chlorophenyl)]methyl free radical

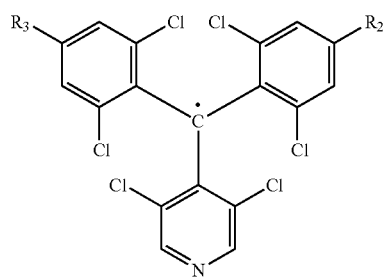

[(3,5-dichloro-4-pyridinyl)(4-(N-carbazolyl)-2,6-dichlorophenyl)](2,4,6-trichlorophenyl)methyl free radical is exemplified for the illustration of the preparation of other derivatives of this class of free radical.

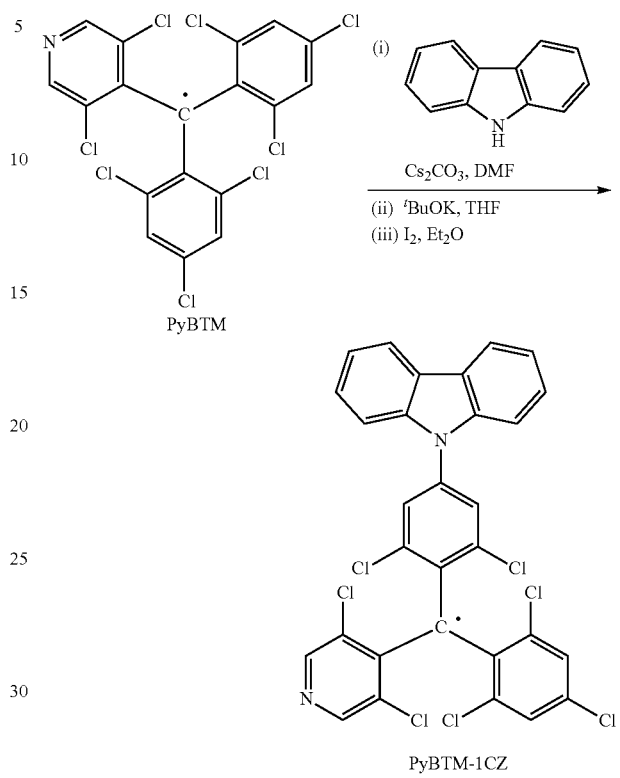

Under the nitrogen atmosphere, a 50 mL two-necked round-bottom flask was charged with (3,5-dichloro-4-pyridinyl)bis(2,4,6-trichlorophenyl)methyl free radical (PyBTM) (0.5 g, 0.96 mmol), carbazole (0.75 g, 4.5 mmol), cesium carbonate (0.47 g, 1.45 mmol) and 20 mL DMF and heated to 160° C. in the dark for 2 h. After the reaction finished, the mixture was cooled to room temperature and poured into a 1 M hydrochloric acid solution, precipitate was filtered, washed with water, dried and purified by Al₂O₃ column chromatography. Under the nitrogen atmosphere, to a 250 mL round-bottom flask, the product (0.656 mg, 1.0 mmol) (obtained from the above step) and 60 mL freshly distilled THF in dark. A potassium tert-butoxide solution in THF (1.55 mL, 1 M) was added dropwise and the mixture was reacted overnight. Then I₂ (1.48 mg, 5.79 mmol) solution in 110 mL anhydrous ethyl ether was added dropwise and the mixture was reacted for 2.25 h. The excessive I₂ was washed with a 10% Na₂S₂O₃ solution three times; the water layer was extracted with ethyl ether several times, dried over anhydrous MgSO₄; the solvent was evaporated. The mixture was purified by Al2O3 column chromatography.

Example 4: Synthesis of (2,4,6-trichloro-5-pyrimidinyl)bis(2,4,6-trichlorophenyl)methyl Free Radical and Derivative Thereof Synthesis of the fourth class (IV) of free radical, they are prepared according to the method in the documents (Tetrahedron, 2006, 62, 5915-5921) and (Angew. Chem. Int. Ed. 2014, 53, 1-5). (3,5-dichloro-4-pyrimidyl)bis(2,4,6-trichlorophenyl)methyl free radical was exemplified for illustration.

Step 1: Preparation of 2,4,6-trichloropyrimidine-5-aldehyde

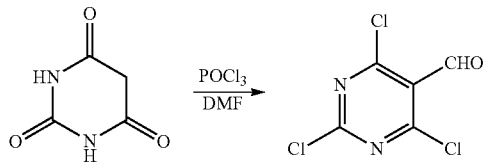

In an ice bath and nitrogen atmosphere, 140 mL phosphorus oxychloride was slowly added into 25 mL of a DMF solution, and the mixture was stirred for 20 min, then barbituric acid (30.0 g, 0.234 mol) was added. The reaction was heated to 120° C. and allowed to reflux for 16 h, then cooled to room temperature and excess amount of phosphorus oxychloride was evaporated under a reduced pressure, the reaction mixture was slowly added into a large amount of ice water (2000 mL) with vigorously stirring, the suspension was stirred for 15 min, then filtered by suction, dried for 24 h. The crude product was purified by silica gel chromatography eluting with petroleum ether:methylene dichloride (2=1; V\V). aAwhite solid is obtained (21 g, 42%). $^1$H NMR and mass spectrometry results confirmed that product was 2,4,6-trichloropyrimidine-5-aldehyde.

Step 2: Preparation of (2,4,6-trichloro-5-pyrimidinyl)bis(2,4,6-trichlorophenyl)methane

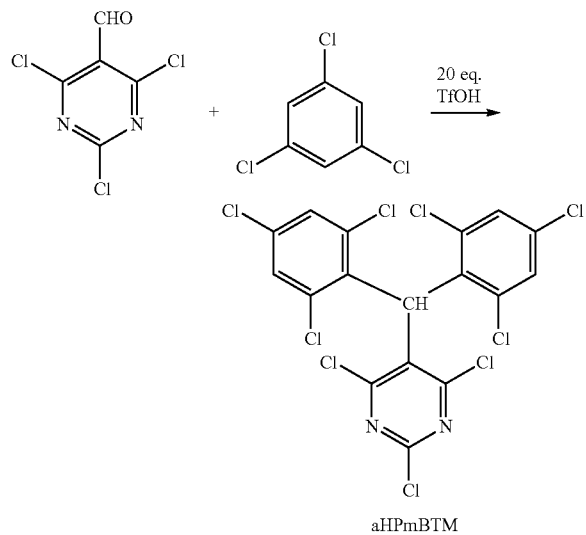

aHPmBTM

Under the nitrogen atmosphere, a 100 mL round-bottom flask was charged with, 3,5-dichloropyrimidine-4-aldehye (2.11 g, 10.0 mmol), 1,3,5-trichlorobenzene (18.14 g, 100 mmol) and trifluoromethanesulphonic acid (30.0 g, 200 mmol) and treated at 180° C. for 10 h. After the reaction was completed, cooling to room temperature. The mixture was dissolved with dichloromethane, added to the ice water. The mixture was neutralized to pH 7 using saturated sodium hydrogen carbonate solution, extracted with methylene dichloride, washed with a sodium hydrogen carbonate solution several times, dried over magnesium sulfate. The solvent was evaporated under a reduced pressure, Product was purified by silica gel chromatography eluting with petroleum ether methylene dichloride=1:1 (V\V). A white solid (1.11 g, 20%) was obtained. $^1$H NMR and mass spectrometry results confirmed that product was (2,4,6-trichloro-5-pyrimidyl)bis (2,4,6-trichlorophenyl)methane.

Step 3

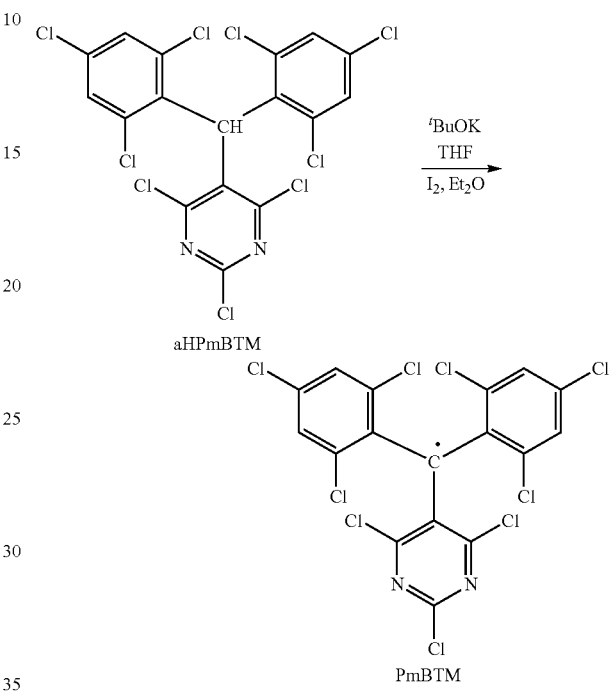

Under the nitrogen atmosphere and in the dark, To a 250 mL round-bottom flask was charged with (2,4,6-trichloro-5-pyrimidinyl)bis(2,4,6-trichlorophenyl)methane(aHP-mBTM) (0.50 mg, 0.90 mmol) and 30 mL freshly distilled THE A potassium tert-butoxide solution in THF (1.4 mL, 1 M) was added dropwise and the reaction mixture turned to red colour immediately and reacted overnight. I$_2$ (1.328 mg, 5.21 mmol) solution in 60 mL anhydrous ethyl ether was added dropwise and the mixture was reacted for 2.25 h. The excessive I$_2$ was washed with a 10% Na$_2$S$_2$O$_3$ solution three times, the water layer was extracted with ethyl ether several times, dried over anhydrous MgSO$_4$. The solvent was evaporated, Product was purified by Al$_2$O$_3$ column chromatography.

Example of the Preparation of Organic Electroluminescent Device Using Organic Neutral Free-Radical Electroluminescent Materials In the present invention, the basic structure of an organic electroluminescent device comprises a substrate, a pair of electrode (an anode and a cathode) and an organic light-emitting layer between this pair of electrodes; the device further comprises a hole transport layer disposed between the light-emitting layer and the anode; (generally an aromatic amine derivative, such as N,N'-diphenyl-N,N'-(1-naphthyl)-1,1'-biphenyl-4,4'-diamine (abbreviation, NPB), 4,4',4"-Tris(3-methylphenylphenylamino)triphenylamine (abbreviation, m-MTDATA), etc.); an electron transport layer disposed between the light emitting layer and the cathode (generally consisting of electron-withdrawing groups, such as 1,3,5-tri(1-phenyl-1-hydrogen-benzimidazole-2-yl)benzene (TPBi)).

The substrate is a transparent base body; the first electrode layer (anode layer) can be an inorganic material or an organic conductive polymer, wherein the inorganic material is generally a metal oxide, such as ITO, zinc oxide, tin zinc oxide, etc., or a metal having a relatively high work function, such as gold, copper, silver, etc., most preferably is selected from ITO, and the organic conductive polymer is a material of one of poly thiophene/sodium polyvinyl benzene sulfonate (abbreviation, PEDOT PSS), polyaniline (abbreviation, PANI); the second electrode layer (cathode layer) is generally a metal having a low work function or an alloy thereof with gold, silver, or a metal fluoride; in the present invention, the cathode layer is preferably LiF/Al.

The light-emitting layer consists of a compound of a general formula in the present invention or a compound of a general formula in the present invention doped into a matrix material. The matrix material in the present invention is 4,4'-di(9-carbazole)biphenyl (abbreviation, CBP) or 1,3'-di(9-carbazole)benzene (abbreviation, mCP) and the doping mass concentration range is 0.1%-50%. The above device structure also can comprise a hole injection layer located between the anode and the hole transport layer, wherein the hole injection layer generally is a metal oxide, such as molybdenum trioxide ($MoO_3$); an electron injection layer disposed between the electron transport layer and the cathode, wherein the electron injection layer material is typically such as lithium fluoride (LiF), fluorine cesium (CsF), cesium carbonate ($Cs_2CO_3$); a hole blocking layer located between the electron transport layer and the light-emitting layer, for example, 2,9-dimethyl-4,7-biphenyl-1,10-o-phenanthroline (abbreviation BCP); an electron blocking layer located between the hole transporting layer and the light-emitting layer, such as 4,4',4''-tri(carbazole-9-yl)triphenylamine (abbreviation TCTA), 4,4'-cyclohexyl[N,N-bis(4-methylphenyl)phenylamine (abbreviation TAPC), mCP.

The device of the present invention is manufactured as follows:

The organic electroluminescent device is prepared by a multi-source organic molecule vapor deposition system, wherein the degree of vacuum of the system can reach $1 \times 10^{-4}$ Pa. The materials to be evaporated are charged in quartz crucibles, wherein the temperature of each crucible can be controlled independently, and the control accuracy is $0.1°$ C. The substrate is placed in the upper part of the vacuum chamber with a distance of 20 cm from the evaporation source. The substrate is treated by the following procedures: the substrate is rinsed with toluene, acetone, ethanol, and deionized water and ultrasonic-cleaned, and then treated by ultraviolet light radiation. The evaporation materials used are placed into different quartz crucibles in the organic molecule vapor deposition system, respectively, and grow the organic materials of different contents and thicknesses according to the designed structure, and during the growing, the degree of vacuum of the system is maintained at about $3 \times 10^{-4}$ Pa. The growth thickness and rate are monitored by a thickness gauge.

The following devices are all prepared according to the above method:

Example 5: Organic Electroluminescent Device Based on 1,3-bisdiphenylene-2-phenylallyl Free Radical (Abbreviation BDPA)

mCP is used as the hole transport layer; $Alq_3$ is used as the electron transport layer; BDPA-doped $Alq_3$ is used as the light-emitting layer. The device has the following structure: ITO/$MoO_3$(5 nm)/mCP(10 nm)/BDPA:$Alq_3$(wt. 10%, 50 nm)/$Alq_3$(10 nm)/LiF(0.8 nm)/Al.

Figure 2:
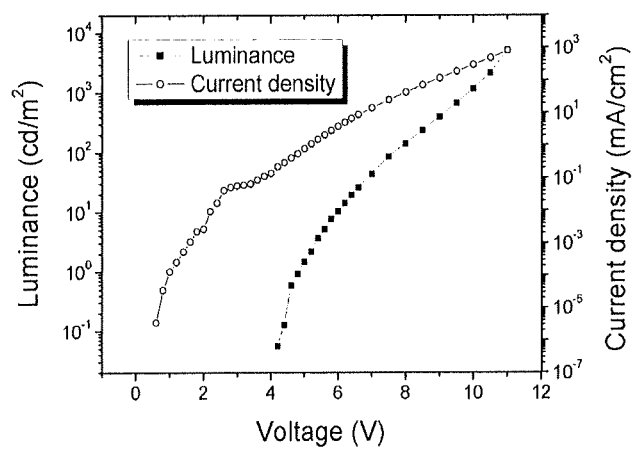
FIG. 2: voltage-current density and voltage-luminance curves of a device, characterizing the voltage-current density and voltage-luminance of the device from example 5.

The electroluminescence spectrum of the device at 6 V is as shown in FIG. 1, the peak wavelength is at 572 nm, and is the emission of BDPA. FIG. 2 is voltage-current density and voltage-luminance curves of the device.

Example 6: Organic Electroluminescent Device Based on a tri(2,4,6-trichlorophenyl)methyl Free Radical Derivative NPB is used as the hole transport layer; TPBi is used as the electron transport layer; CBP doped with [4-(N-carbazolyl)-2,6-dichlorophenyl]bis(2,4,6-trichlorophenyl)-methyl free radical (abbriviation, TTM-1Cz) is used as the light-emitting layer; the structure is: ITO/NPB (30 nm)/TTM-1Cz: CBP (wt. 5%; 40 nm)/TPBI (35 nm)/LiF (0.8 nm)/Al (100 nm).

Figure 3:
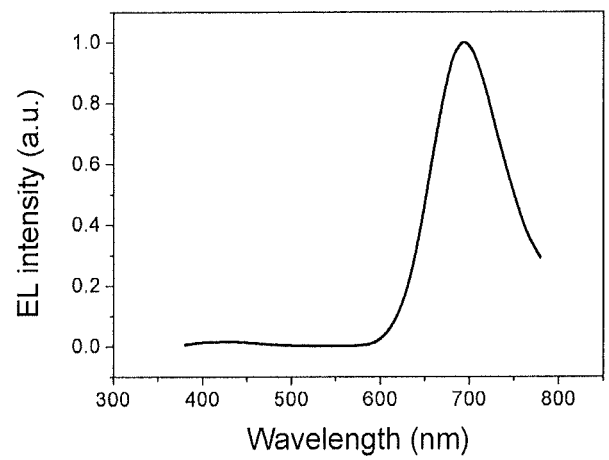
FIG. 3: an electroluminescence spectrum of a device at a voltage of 7 V, characterizing the luminescence spectrum of the device from example 6.
Figure 4:
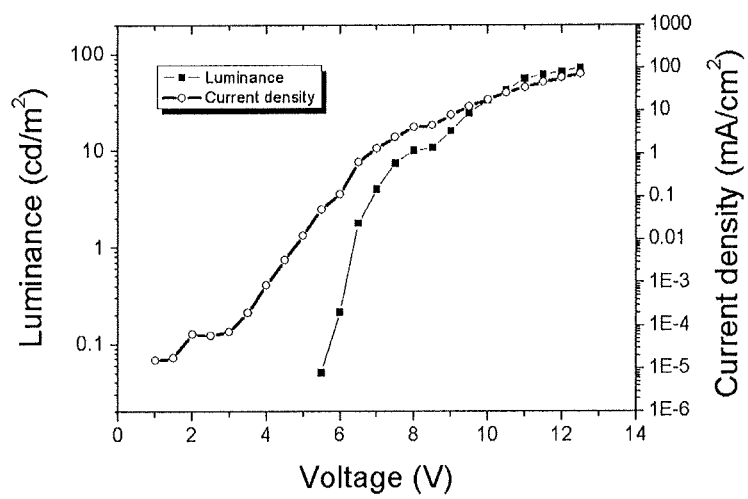
FIG. 4: voltage-current density and voltage-luminance curves of a device, characterizing the voltage-current density and voltage-luminance of the device from example 6.

The electroluminescence spectrum of the device at 7 V is as shown in FIG. 3, the peak wavelength is at 694 nm, and is the emission of TTM-1Cz. FIG. 4 is voltage-current density and voltage-luminance curves of the device.

Example 7: Organic Electroluminescent Device Based on (3,5-dichloro-4-pyridinyl)bis(2,4,6-trichlorophenyl)methyl Free Radical mCP is used as the hole transport layer; PO-T2T is used as the electron transport layer; PO-T2T doped with (3,5-dichloro-4-pyridinyl)bis(2,4,6-trichlorophenyl)methyl free radical (abbreviation, PyBTM) is used as the light-emitting layer; the structure is: ITO/MoO3(6 nm)/mCP(10 nm)/PyBTM:PO-T2T(wt. 7%, 25 nm)/PO-T2T(30 nm)/LiF(0.8n m)/Al(100 nmn).

Figure 5:
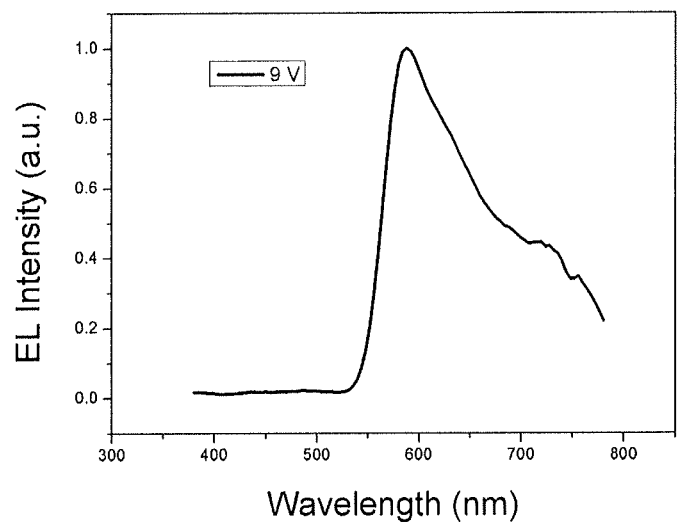
FIG. 5: an electroluminescence spectrum of a device at a voltage of 9 V, characterizing the luminescence spectrum of the device from example 7.

The electroluminescence spectrum of the device at 9 V is as shown in FIG. 5, the peak wavelength is at 694 nm, and is the emission of PyBTM.

Figure 6:
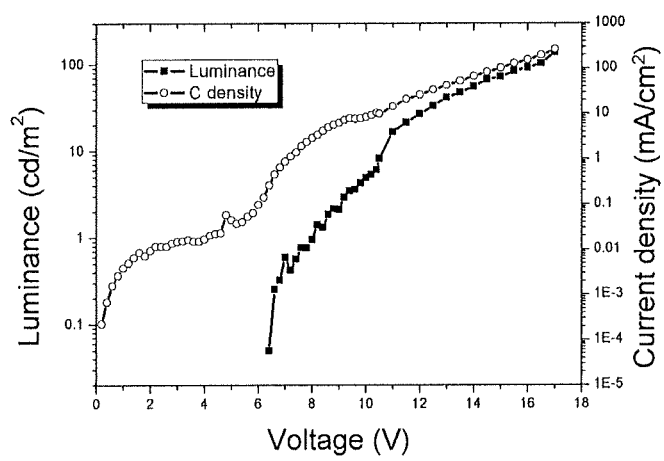
FIG. 6: voltage-current density and voltage-luminance curves of a device, characterizing the voltage-current density and voltage-luminance of the device from example 7.

FIG. 6 is voltage-current density and voltage-luminance curves of the device.

Some accessory materials used in the present invention have the following structures (all raw materials used in the present invention can be purchased):

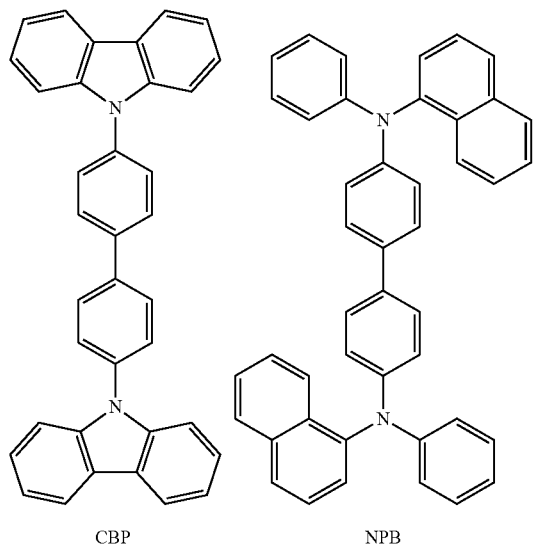

CBP NPB

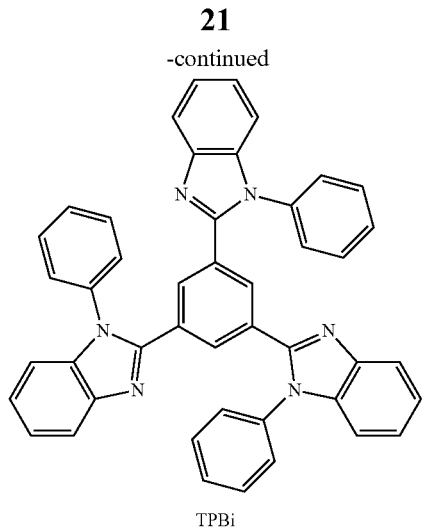

TPBi

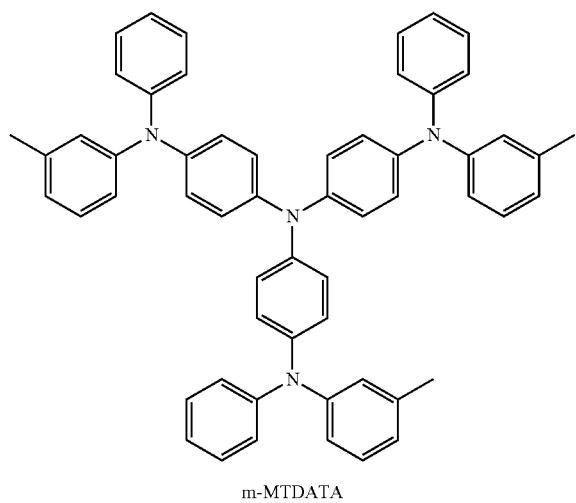

m-MTDATA

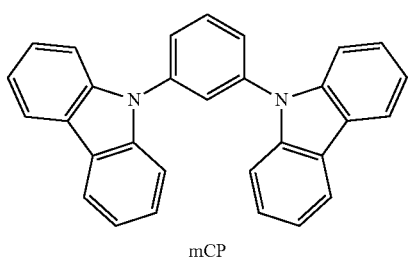

mCP

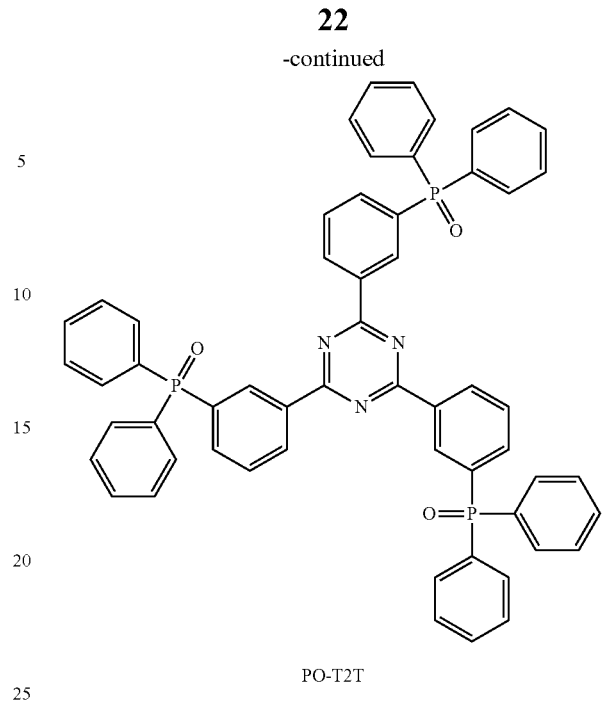

PO-T2T

Although the present invention is illustrated in combination with the embodiments, the present invention is not limited to the above embodiments; it is to be understood that a person skilled in the art can made various modifications and improvements under the teaching of the concept of the present invention; the scope of the present invention is covered by the claims attached.

The invention claimed is:

1. An organic electroluminescent device, comprising a light-emitting layer that includes a neutral π-free-radical electroluminescent material,
wherein the neutral π-free-radical electroluminescent material is classified into four classes represented by the following Formulae (I)-(IV):

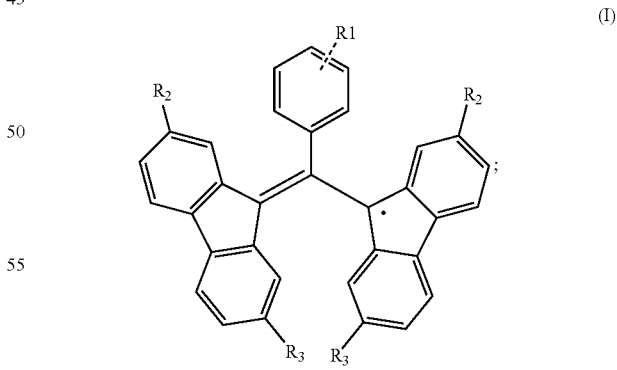

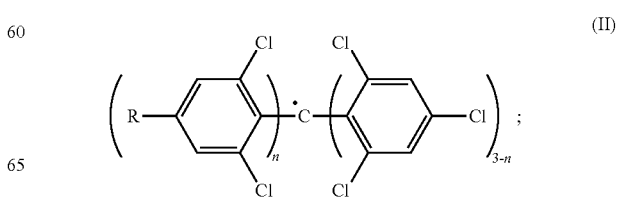

23

-continued

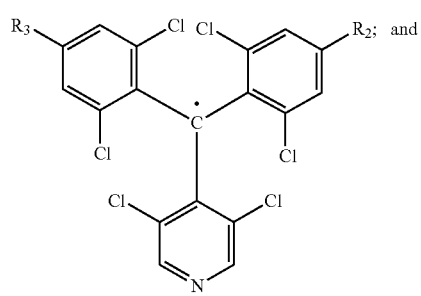

(III)

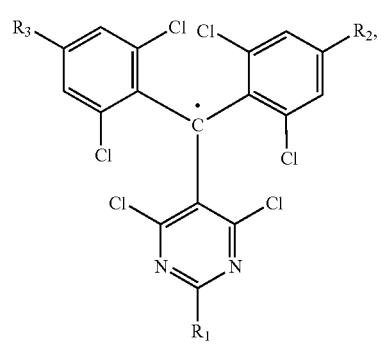

(IV)

wherein n is 1, 2, or 3, wherein R, $R_1$, $R_2$, and $R_3$ are the same or different, R, $R_1$, $R_2$ and $R_3$ are each independently selected from an aromatic amine, a heterocyclic aromatic hydrocarbon, a fused ring aromatic hydrocarbon compound, an atom, a group, or a combination thereof, wherein the aromatic amine, heterocyclic aromatic hydrocarbon, fused ring aromatic hydrocarbon compound, atom, or group are represented by the following formulae: H; F; Cl; CN;

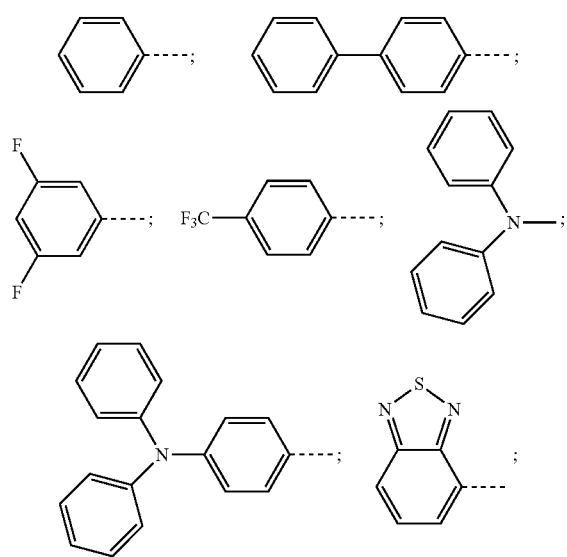

24

-continued

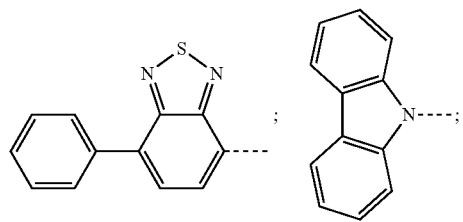

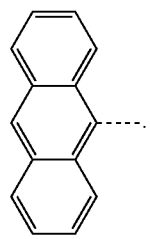

2. An organic electroluminescent device, comprising a light-emitting layer that includes a neutral free-radical electroluminescent material doped in a matrix material, wherein the neutral free-radical electroluminescent material is classified into four classes represented by the following Formulae (I)-(IV):

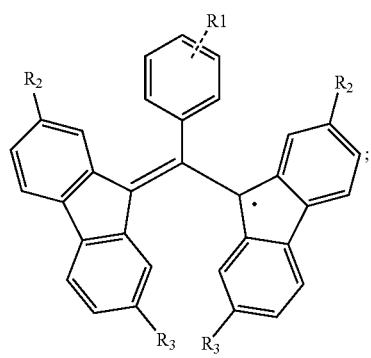

(I)

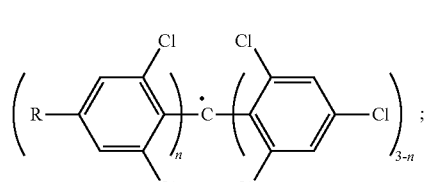

(II)

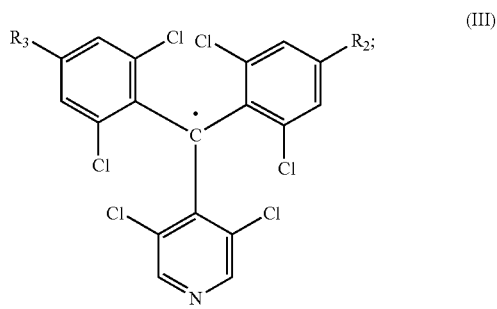

(III)

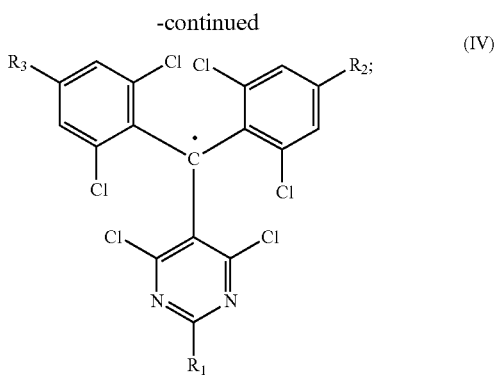

(IV)

wherein n is 1, 2, or 3,
wherein R, R₁, R₂, and R₃ are the same or different,
R, R₁, R₂ and R₃ are each independently selected from an aromatic amine, a heterocyclic aromatic hydro carbon, a fused ring aromatic hydrocarbon compound, an atom, a croup, or a combination thereof, wherein the aromatic amine, heterocyclic aromatic hydrocarbon, fused ring aromatic hydrocarbon compound, atom, or group are represented by the following formulae: H; F; Cl; CN;

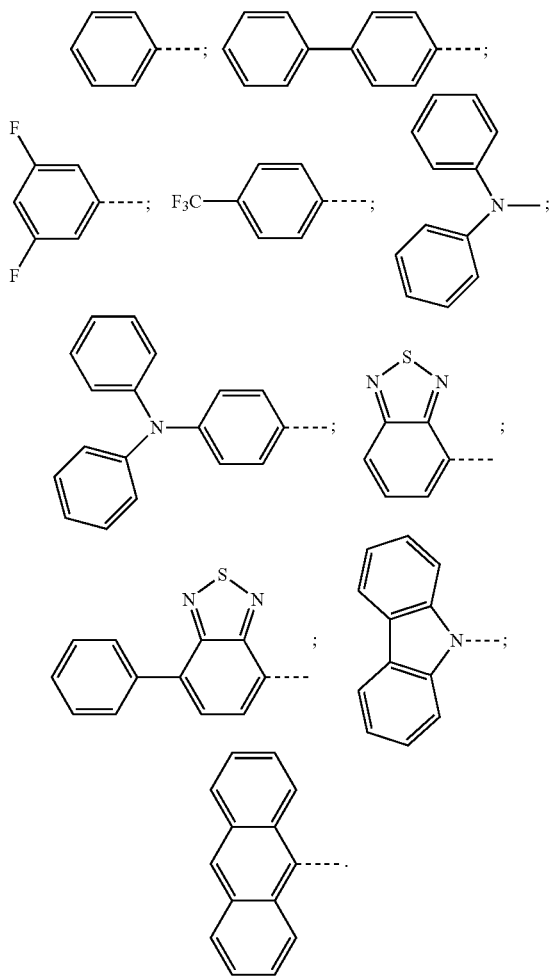

3. The organic electroluminescent device according to claim 1, wherein the organic electroluminescent device further comprises a substrate and a pair of electrodes including an anode and a cathode, and said light-emitting layer is located between the pair of electrodes.

4. The organic electroluminescent device according to claim 3, wherein the organic electroluminescent device further comprises a hole transport layer disposed between the light-emitting layer and the anode, and said hole transport layer contains an aromatic amine derivative.

5. The organic electroluminescent device according to claim 4, wherein the aromatic amine derivative is N,N'-diphenyl-N,N'-(1-naphthyl)-1, 1'-biphenyl-4,4'-diamine (NPB), 4,4',4"-Tris(3-methylphenylphenylamino)triphenylamine (m-MTDATA).

6. The organic electroluminescent device according to claim 3, wherein the organic electroluminescent device further comprises an electron transport layer disposed between the light-emitting layer and the cathode, and said electron transport layer includes electron-withdrawing groups.

7. The organic electroluminescent device according to claim 6, wherein said electron transport layer includes 1,3,5-tri(1-phenyl-1-hydrogen-benzimidazole-2-yl)benzene (TPBi).

8. The organic electroluminescent device according to claim 4 wherein said organic electroluminescent device further comprises a hole injection layer located between the anode and the hole transport layer and said hole injection layer is a metal oxide.

9. The organic electroluminescent device according to claim 6, wherein said organic electroluminescent device further comprises a electron injection layer located between the electron transport layer and the cathode, and said electron injection layer is formed of lithium fluoride (LiF), caesium fluoride (CsF) or caesium carbonate ($Cs_2CO_3$).

10. The organic electroluminescent device according to claim 9, wherein said organic electroluminescent device further comprises a hole blocking layer located between the electron transport layer and the light-emitting layer.

11. The organic electroluminescent device according to claim 4, wherein said organic electroluminescent device further comprises an electron blocking layer located between the hole transport layer and the light-emitting layer.

12. The organic electroluminescent device according to claim 2, wherein the organic electroluminescent device further comprises a substrate, and a pair of electrodes including an anode and a cathode, and said light-emitting layer is located between the anode and the cathode.

13. The organic electroluminescent device according to claim 5, wherein said organic electroluminescent device further comprises a hole injection layer located between the anode and a hole transport layer, and said hole injection layer is a metal oxide.

14. The organic electroluminescent device according to claim 7, wherein said organic electroluminescent device further comprises a electron injection layer located between an electron transport layer and the cathode, and said electron injection layer is lithium fluoride (LiF), caesium fluoride (CsF) or caesium carbonate ($Cs_2CO_3$).

15. The organic electroluminescent device according to claim 7, wherein said organic electroluminescent device further comprises a hole blocking layer located between an electron transport layer and the light-emitting layer.

16. The organic electroluminescent device according to claim 5, wherein said organic electroluminescent device further comprises an electron blocking layer located between a hole transport layer and the light-emitting layer.

* * * * *